United States Patent [19]

Sugimoto

[11] Patent Number: 4,656,423
[45] Date of Patent: Apr. 7, 1987

[54] NUCLEAR MAGNETIC RESONANCE DIAGNOSTIC APPARATUS

[75] Inventor: Hiroshi Sugimoto, Tochigi, Japan

[73] Assignee: Tokyo Shibaura Denki Kabushiki Kaisha, Kawasaki, Japan

[21] Appl. No.: 548,771

[22] Filed: Nov. 4, 1983

[30] Foreign Application Priority Data

Nov. 8, 1982 [JP] Japan ................... 57-196483

[51] Int. Cl.$^4$ ........................... G01R 33/20
[52] U.S. Cl. ..................... 324/309; 324/318
[58] Field of Search ............ 324/309, 307, 318, 319, 324/312

[56] References Cited

U.S. PATENT DOCUMENTS

| 3,932,805 | 1/1976 | Abe | 324/309 |
|---|---|---|---|
| 4,015,196 | 3/1977 | Moore | 324/309 |
| 4,021,726 | 5/1977 | Garroway | 324/312 |
| 4,115,730 | 9/1978 | Mansfield | 324/309 |
| 4,297,637 | 10/1981 | Crooks | 324/309 |
| 4,300,096 | 11/1981 | Harrison | 324/309 |
| 4,318,043 | 3/1982 | Crooks et al. | 324/309 |
| 4,471,305 | 9/1984 | Crooks | 324/309 |
| 4,475,084 | 10/1984 | Moore et al. | 324/309 |
| 4,486,708 | 12/1984 | Macovski | 324/309 |
| 4,509,011 | 4/1985 | Sugimoto et al. | 324/309 |

FOREIGN PATENT DOCUMENTS

| 0042255 | 12/1981 | European Pat. Off. | 324/309 |
|---|---|---|---|
| 0055058 | 6/1982 | European Pat. Off. | 324/309 |
| 0134701 | 3/1985 | European Pat. Off. | |
| 2128746 | 2/1984 | United Kingdom | 324/309 |

OTHER PUBLICATIONS

"An Overview of NMR in Medicine" by D. I. Hoult, NCHCT Monograph Series, Feb. 1981.
"Superconducting and Resistive Magnets in NMR Scanning" by Peter Hanley, International Symposium on NMR Imaging, pp. 41-49, Oct. 1-3, 1981.

Primary Examiner—Michael J. Tokar
Assistant Examiner—Scott M. Oldham
Attorney, Agent, or Firm—Cushman, Darby & Cushman

[57] ABSTRACT

An NMR diagnostic apparatus capable of obtaining tomographic images in any direction and in any portion of the patient. A magnetic device applies a static magnetic field along a longitudinal axis of the patient. A first coil device is arranged along this longitudinal axis and applies a first gradient magnetic field in conjunction with the static magnetic field so as to define a slice in the patient which is to be examined. The first coil device also applies at least one second gradient magnetic field which defines a projection angle from which NMR signals are obtained. A probe head coil device applies RF pulses to excite nuclei in the slice and to detect the NMR signals emanating from the slice. A second coil device is arranged along the longitudinal axis and applies to the slice a shifting magnetic field which shifts a magnetically-zero plane of the first gradient magnetic field in a direction perpendicular to the magnetically-zero plane. A plurality of second coil means may be provided to shift a magnetically-zero plane throughout the patient so that slices in any portion of the patient may be examined.

8 Claims, 24 Drawing Figures

F I G. 2
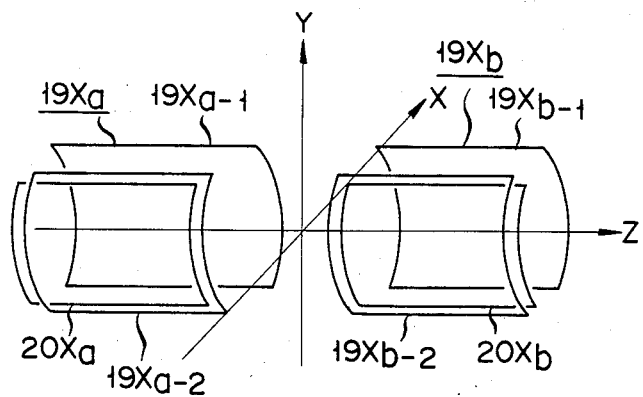
F I G. 3
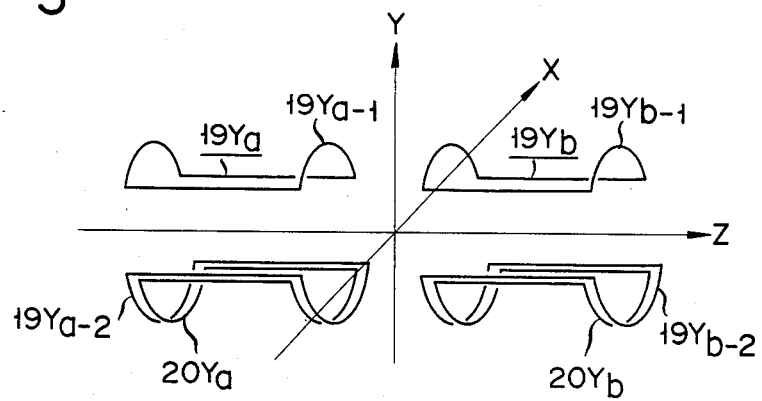
F I G. 4
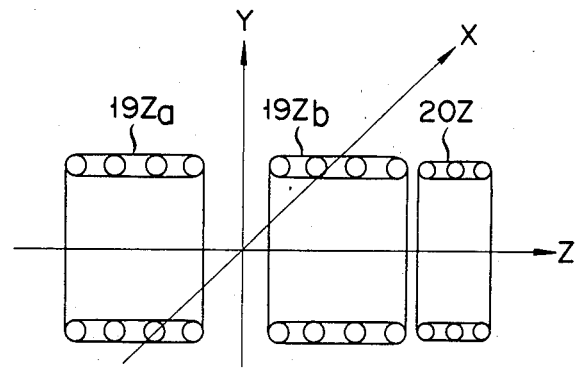

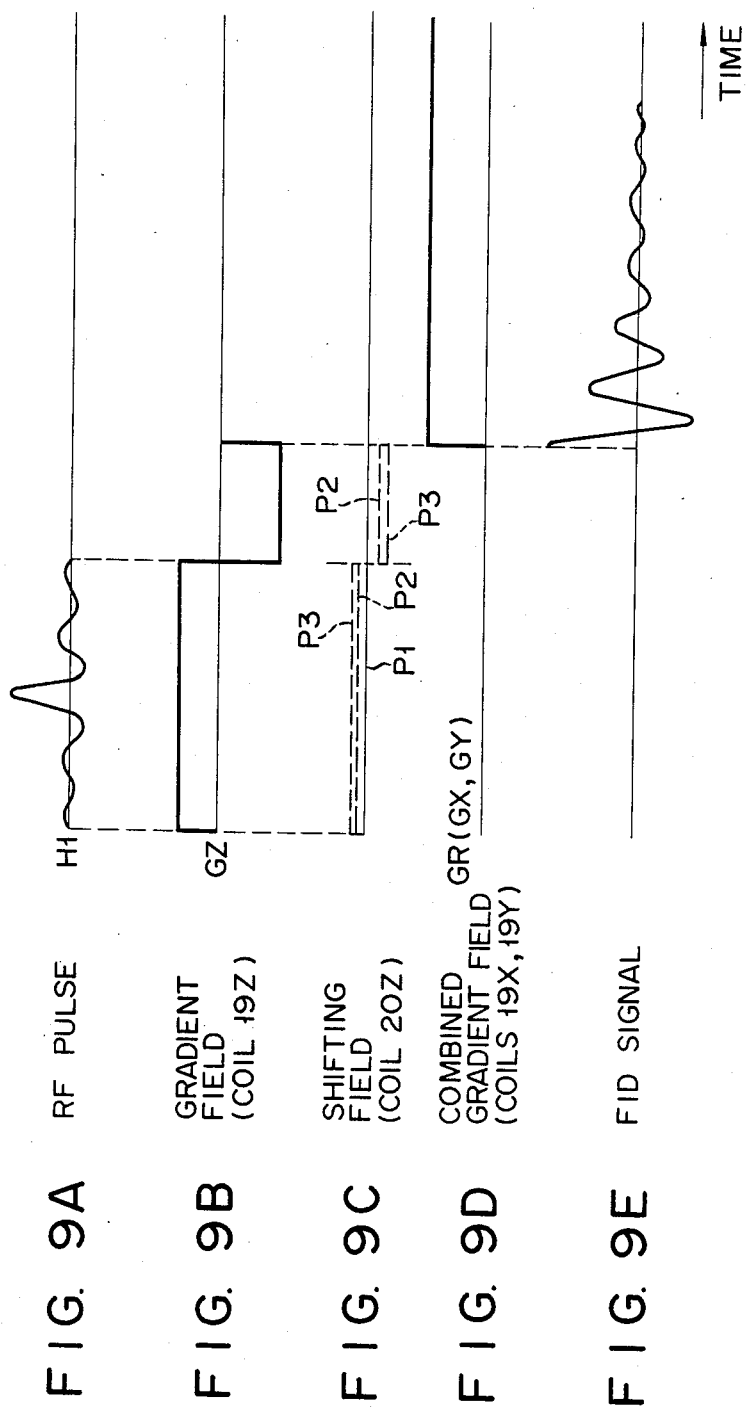

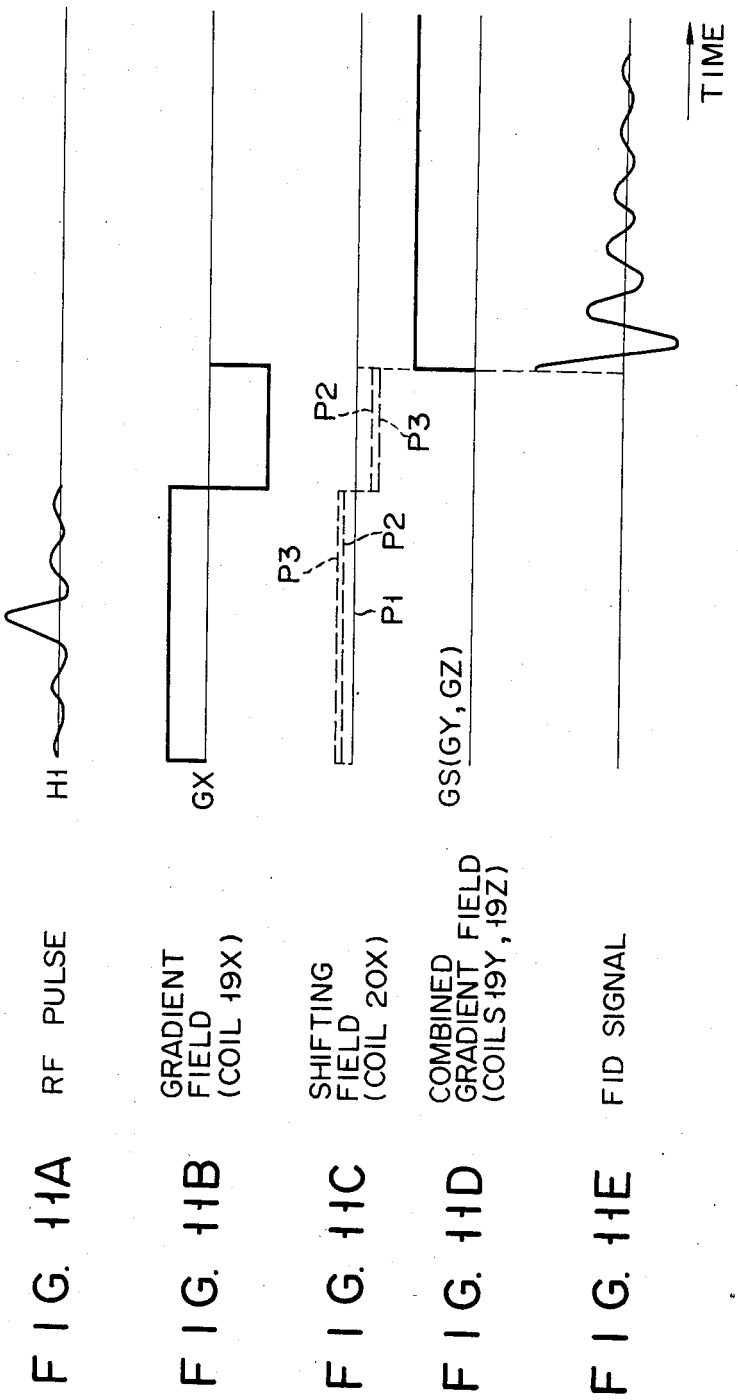

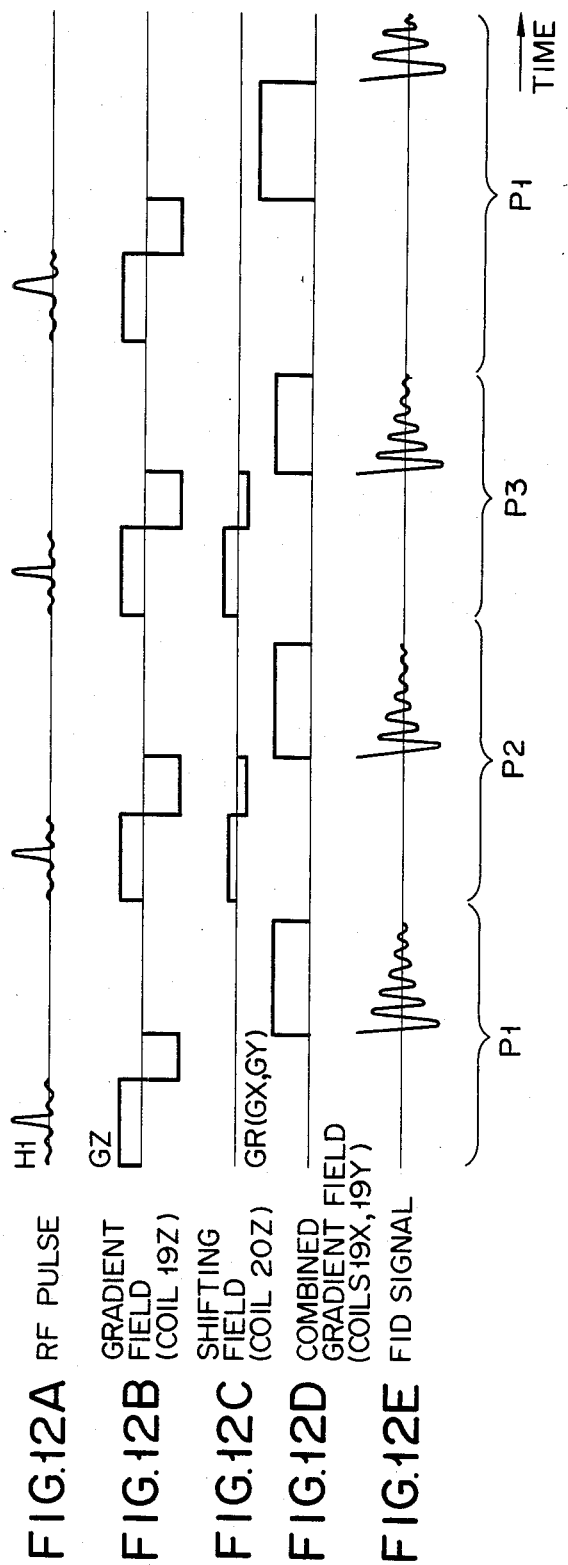

NUCLEAR MAGNETIC RESONANCE DIAGNOSTIC APPARATUS

This application is related to co-pending U.S. patent application No. 526,277 now U.S. Pat. No. 4,568,880.

BACKGROUND OF THE INVENTION

1. Field of the Invention

The present invention relates to a nuclear magnetic resonance diagnostic apparatus (to be referred to as an "NMR diagnostic apparatus" hereinafter) which utilizes the magnetic resonance phenomenon so as to noninvasively measure information as to the density and relaxation time of a specific atomic nucleus or proton within a selected sectional slice plane of an object to be examined, e.g., a patient, for which a tomographic image is taken, and to display information for medical diagnosis in the form of tomographic images.

2. Description of the Prior Art

In a conventional NMR diagnostic apparatus, a tomographic image plane (i.e., selected sectional slice plane) in a patient to be examined is limited to a plane which intersects a central point defined by gradient magnetic coils at which the strength of the gradient magnetic field is zero. For this reason, in order to obtain a plurality of adjacent sagittal images, the patient must be mechanically moved to the central point for each imaging. With such a conventional NMR diagnostic apparatus, a long time is generally required to collect data for obtaining one specific tomographic image by rotating the gradient direction of a gradient magnetic field at 360° in a plane perpendicular to the longitudinal axis of the patient with respect to the selected sectional slice plane of which a tomographic image is taken. Accordingly when more than one tomographic image is to be obtained, a still longer data collection time is required, resulting in a heavier imposition on the patient and disturbance in fast diagnosis.

The present invention has been made in consideration of the conventional drawbacks, and has for its object to provide a nuclear magnetic resonance diagnostic apparatus which does not require mechanical movement of a patient with respect to the longitudinal axis thereof during NMR signal collection, which is capable of obtaining tomographic images in any direction and at any portion of the patient, and which allows adoption of the multi-slice method.

SUMMARY OF THE INVENTION

The above-described object of the invention may be accomplished by providing a nuclear magnetic resonance diagnostic apparatus in which a substantially two-dimensional, magnetically null plane may be shifted in a direction perpendicular to the magnetically null plane. Static magnetic means are provided to generate a static magnetic field in the apparatus. A first magnetic gradient coil is used to provide a first magnetic gradient field superimposed over the static magnetic field. Thus, the combination of the first magnetic gradient field with the static magnetic field defines a slice inside the object to be examined with the same magnetic field intensity. A second gradient magnetic field coil then applies a second gradient magnetic field superimposed over the static magnetic field to define a projection angle of nuclear magnetic resonant signals. The second magnetic field gradient is applied in a direction orthogonal to the longitudinal axis of the patient. RF coil means are also provided to generate RF pulses to selective excite the nuclei within the defined slice. The excited nuclei generate magnetic resonant signals which are detected by detection means.

In order to shift a substantially two-dimensional magnetically null plane inside the patient, shifting coil means are provided. These shifting coil means can move the substantially two-dimensional magnetically null plane in a direction perpendicular to the null plane.

Reconstruction means are also provided to process the detected resonance signals and provide display information representing a two-dimensional matrix of elements within the slice.

BRIEF DESCRIPTION OF THE DRAWINGS

The features and the other objects of the invention will be best understood with reference to the accompanying drawings, in which:

FIGS. 2, 3 and 4 show illustrations of gradient magnetic field coils and gradient magnetic field shifting coils in the X, Y and Z axes respectively;

FIGS. 9A–9E is a timing chart for explaining a shift operation of the cross-sectional planes;

FIGS. 11A–11E is a timing chart for explaining a shift operation of the sagittal image planes; and FIGS. 12A–12E is a timing chart for explaining a multi-slice method.

DETAILED DESCRIPTION OF THE PREFERRED EMBODIMENTS

Figure 1:
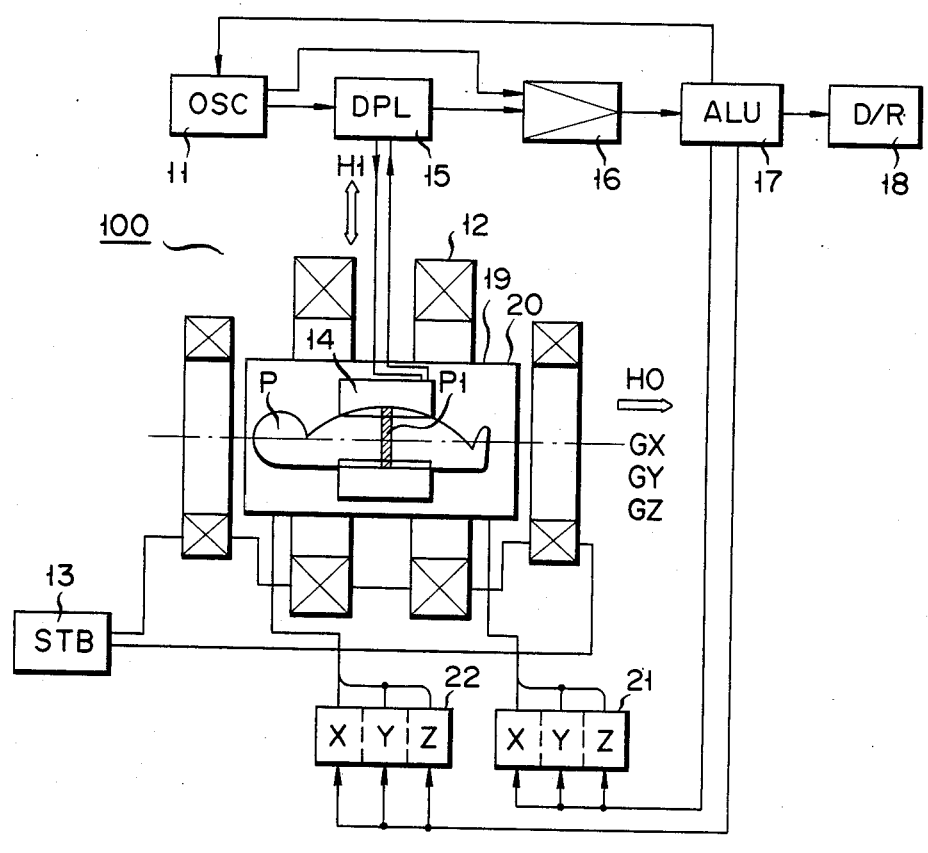
FIG. 1 shows a schematic diagram of an entire NMR diagnostic apparatus according to one preferred embodiment of the invention.

FIG. 1 shows the configuration of a nuclear magnetic resonance diagnostic apparatus 100 (referred to as an "NMR diagnostic apparatus" hereinafter) according to an embodiment of the present invention.

Referring to FIG. 1, an oscillator 11 generates a selective exciting RF pulse $H_1$. Air magnetic field coils 12 extend perpendicular to a longitudinal axis Z of a patient P. A probe head coil 14, three sets of gradient magnetic field coils 19, and three sets of gradient magnetic field shifting coils 20 are assembled within the coils 12, as shown in FIG. 2. The air magnetic field coils 12 apply a static magnetic field $H_0$ to the patient P uniformly along the Z axis. The RF pulse $H_1$ is applied to the selected sectional slice plane of the patient P through the probe head coil 14 in a direction of the Y axis which is perpendicular to the Z axis to cause a predetermined NMR phenomenon, thereby detecting from the patient P the NMR signals, e.g., echo pulse signals or free induction decay signals (FID signals).

A stabilizer 13 is connected to the air magnetic field coils 12 for supplying stabilized power to the coils 12. A power supply source 21 for supplying power to generate gradient magnetic fields $G_X$, $G_Y$, and $G_Z$ in the X, Y and Z directions, respectively, is connected to the gradient magnetic field coils 19. A power supply source 22 for supplying power to the three sets of gradient magnetic field shifting coils 20 is connected thereto for spatially moving XY, YZ, and ZX planes at which the gradiaent magnetic field is zero. A duplexer 15 is connected to the output terminal of the oscillator 11. The duplexer 15 applies the RF pulse $H_1$ from the oscillator 11 to the patient P through the probe head coil 14. Then, the duplexer 15 receives NMR signals produced by the specific atomic nucleus in the patient P. In this manner, the duplexer 15 serves as an RF switch and a tuned circuit.

An amplifier 16 amplifies an NMR signal received by the duplexer 15 from the probe head coil 14. A digital arithmetic logic unit 17 performs various functions: A/D conversion of the amplified NMR signal, data processing involving calculation of a Fourier transform, supply of a signal to the oscillator 11 for control of the generating timing of the RF pulse $H_1$, and control of the strength, generating timing, and rotation of the gradient magnetic fields. A display/recording device 18 displays or records the measurement results.

The power supply sources 21 and 22 are controlled by the digital arithmetic logic unit 17.

The construction of the gradient magnetic field coils 19 and the gradient magnetic field shifting coils 20 especially related to the principle of the present invention will be described in detail.

As shown in FIG. 2, the X-axis magnetic field coil assembly of the gradient magnetic field coils 19 consists of two units of coils, i.e., one unit of saddle-shaped coil $19X_a$ and another unit of saddle-shaped coil $19X_b$, each of which is composed of two coil halves $19X_{a-1}$, $19X_{a-2}$ and $19X_{b-1}$, $19X_{b-2}$ respectively. Those units of saddle-shaped coils $19X_a$ and $19X_b$ constitute a pair of X-axis magnetic field coil assemblies. Each of the coil halves $19X_{a-1}$, $19X_{a-2}$, $19X_{b-1}$ and $19X_{b-2}$ are disposed in such a manner that for instance, the coil half $19X_{a-1}$ is faced with the coil half $19X_{a-2}$ along the Z-axis. The two units of coils $19X_a$ and $19X_b$ are wound in the opposite directions and are connected to the X-axis part (indicated by the broken line at the left in FIG. 1) of the single power supply source 21. Accordingly, the direction of a magnetic field $G_X$ generated by the X-axis coil $19X_a$ at the left of FIG. 2 is opposite to that of a magnetic field $G_X$ generated by the X-axis coil $19X_b$ at the right of FIG. 2. This means that there is a plane at an intermediate point between the coils where the strength of the magnetic field $G_X$ is zero (referred to as a "magnetically-zero plane" hereinafter).

The construction of the Y-axis coil units $19Y_a$ and $19Y_b$ is the same as the X-axis coil assembly. As shown in FIG. 3, each unit of saddle-shaped coils $19Y_a$ and $19Y_b$ oppose each other having the Z axis at the center, and extend therealong at positions 90° rotated with respect to the X-axis coil units $19X_a$ and $19X_b$.

As for the Z-axis coil assembly, as shown in FIG. 4, a pair of ring-shaped solenoid coils $19Z_a$ and $19Z_b$ oppose each other having the Z axis at the center and extend therealong.

As the winding directions of the coil units $19Y_a$ and $19Y_b$ and the coils $19Z_a$ and $19Z_b$ and their connections to the power supply source 21 are the same as those of the coils $19X_a$ and $19X_b$, the description will not be made again.

The distribution of the magnetic fields generated by these gradient magnetic field coils 19 will now be described.

Figure 5:
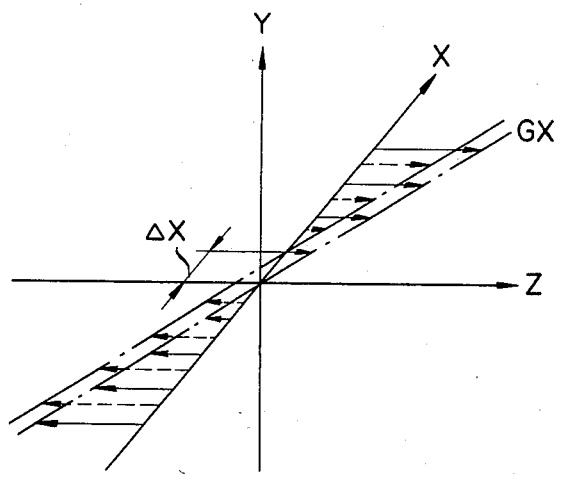
FIGS. 5, 6 and 7 show illustrations of the gradient magnetic fields $G_X$, $G_Y$ and $G_Z$ and of the shifted gradient magnetic fields, respectively.
Figure 6:
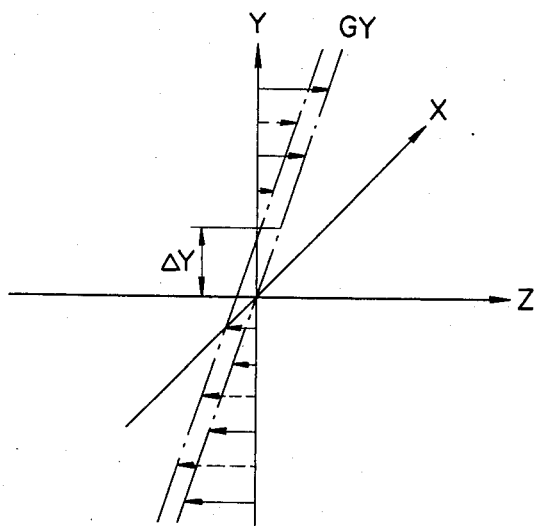
Figure 7:
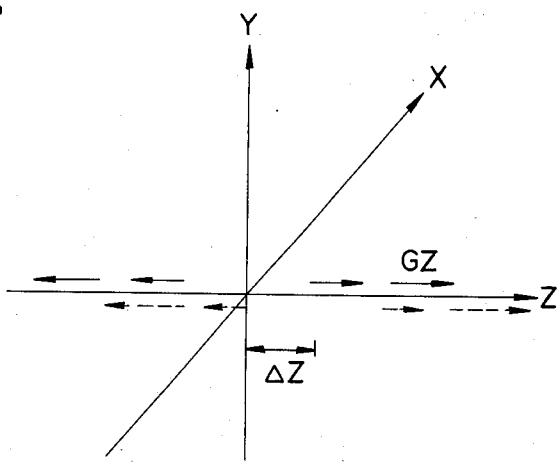

When an energizing current flows through the X-axis coil units $19X_a$ and $19X_b$, lines of magnetic force are directed along the Z axis as indicated by the solid line shown in FIG. 5, and the X-axis gradient magnetic field $G_X$ is generated in such a manner that the strength of the field is zero at a substantially intermediate point where $x=0$ (i.e., the intersection of the X, Y and Z axes), the strength increases in the positive direction when $x>0$ (the upper right portion in the graph), and the strength increases in the negative direction (lower left portion in the graph) when $x<0$. Similarly, when current flows to the Y-axis coil units $19Y_a$ and $19Y_b$, the Y-axis gradient magnetic field $G_Y$ as indicated by the solid line shown in FIG. 6 is generated. When an energizing current flows through the Z-axis solenoid coils $19Z_a$ and $19Z_b$, a gradient magnetic field $G_Z$ as indicated by the solid line shown in FIG. 7 is generated.

Regarding the gradient magnetic field shifting coils 20, as shown in FIG. 2, a pair of left and right saddle-shaped coils $20X_a$ and $20X_b$ are arranged along the Z-axis in such a manner that each overlaps practically a coil half ($19X_{a-2}$ and $19X_{b-2}$) of each of coil units $19X_a$ and $19X_b$. Likewise, a pair of saddle-shaped coils $20Y_a$ and $20Y_b$ are arranged along the Z axis in such a manner that each overlaps practically a coil half ($19Y_{a-2}$ and $19Y_{b-2}$) of each of coil units $19Y_a$ and $19Y_b$, as shown in FIG. 3. Furthermore, as shown in FIG. 4, a ring-shaped solenoid coil 20Z having the Z axis at its center is arranged in such a manner that it is adjacent to one of the coil units $19Z_a$ and $19Z_b$.

When an energizing current flows in the coils $20X_a$ and $20X_b$, as shown in FIG. 5, the gradient field $G_X$ is shifted parallel to the X axis by an amount $\Delta X$. Similarly, when an energizing current flows in the coils $20Y_a$ and $20Y_b$, as shown in FIG. 6, the gradient magnetic field $G_Y$ is shifted parallel to the Y axis by an amount $\Delta Y$. When an energizing current flows in the solenoid coil 20Z, the gradient magnetic field $G_Z$ is shifted parallel to the Z axis by an amount $\Delta Z$. For example, when an energizing current flows to the coil units $19X_a$ and $19X_b$ and the coil units $20X_a$ and $20X_b$, the combined magnetic field distribution differs from the distribution of the magnetic field $G_X$ obtained with the coils $19X_a$ and $19X_b$ alone (i.e., shifted toward the X axis by the amount $\Delta X$).

It should be noted that the solenoid coil 20Z may be alternatively wound concentrically as in the case of the gradient magnetic field coil $19Z_b$. Any construction may be adopted if the magnetic fields generated by the coils $19Z_b$ and 20Z can be combined.

The mode of operation of the NMR diagnostic apparatus having the construction as described above will now be described.

Figure 8:
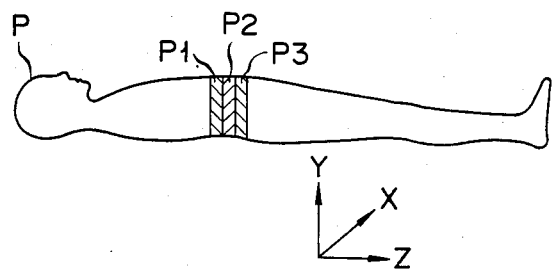
FIG. 8 shows cross-sectional planes of a patient.

Referring to FIG. 1, the patient P is placed within the air magnetic field coils 12 while the air magnetic field coils 12 and the stabilizer 13 apply a static magnetic field $H_0$ in the Z direction. Subsequently, the selective exciting RF pulse $H_1$ is generated by the oscillator 11, and the RF pulse $H_1$ is applied to the patient P in the Y direction through the duplexer 15 and the probe head coil 14, thereby causing nuclear magnetic resonance of a specific atomic nucleus such as hydrogen nucleus in the selected sectional slice plane of the patient P. In synchronism with the application of the RF pulse $H_1$, the gradient magnetic fields $G_X$, $G_Y$ and $G_Z$ are applied by the gradient magnetic field coils 19 so as to selectively excite the slice plane to which tomographic image is taken (referred simply to as a tomographic image plane). For example, in the case of a cross-sectional tomographic image plane as shown in FIG. 8, a current flows to the solenoid coils 19Z as shown in FIG. 9B in synchronism with the RF pulse $H_1$ as shown in FIG. 9A so as to apply a gradient magnetic field $G_Z$ in the Z direction. The slice position or place and thickness are determined by the frequency of the RF pulse $H_1$ and the gradient angle of the gradient magnetic field $G_Z$. For example, if the frequency of the RF pulse $H_1$ coincides with the NMR frequency, the XY plane of $Z=0$ (where the gradient magnetic field strength is zero i.e., so-called "magnetically-zero plane") becomes the tomographic image plane $P_1$. This is the case wherein the magnetic field generated by the solenoid coil 20Z is not yet applied. However, when the magnetic field generated by the solenoid coil 20Z is additionally applied, the magnetically-zero XY plane at which the gradient magnetic field $G_Z$ becomes zero is shifted in the positive direction along the Z axis. Accordingly, the slice plane is shifted in the positive direction along the Z axis (to the right in FIG. 8) in correspondence to the shifting magnetic field strength. Then, the slice plane becomes as $P_2$ and $P_3$ as shown in FIG. 8. In this manner, the slice plane i.e., tomographic image plane can be moved without requiring mechanical movement of the patient P.

Subsequently, as shown in FIG. 9D, the gradient magnetic fields $G_X$ and $G_Y$ in the X and Y directions are generated by the coils 19X and 19Y, and the vector sum thereof, $G_R=G_X=G_Y$, that is, a combined gradient field is applied to the patient P, an NMR signal (FID signal) corresponding to a projection signal in the direction of the vector sum $G_R$ is generated from the patient P as shown in FIG. 9E. The NMR signal is detected by the probe head coil 14 and is supplied to the amplifier 16 through the duplexer 15 for amplification. The amplified NMR signal is A/D converted by the digital arithmetic logic unit 17 so as to rotate $G_R$ around the Z axis. Then, image reconstruction is carried out which includes calculation of Fourier transforms on the basis of the NMR signals from the respective rotating direction, i.e., the projection angle. The obtained reconstructed image is displayed at the display/recording device 18 and is recorded as needed. In addition to the image reconstruction, the digital arithmetic logic unit 17 performs control of the generation timing of the RF pulse $H_1$, rotating timing and strengths of the gradient magnetic fields, and magnetic field parallel shift timing and strengths of the gradient magnetic field shifting coils 20, through the oscillator 11 and the power supply sources 21 and 22.

As shown in FIG. 9B, the gradient magnetic field $G_Z$ is generated in the Z direction so as to align the selectively generated macroscopic magnetic moment on the Z axis.

Figure 10:
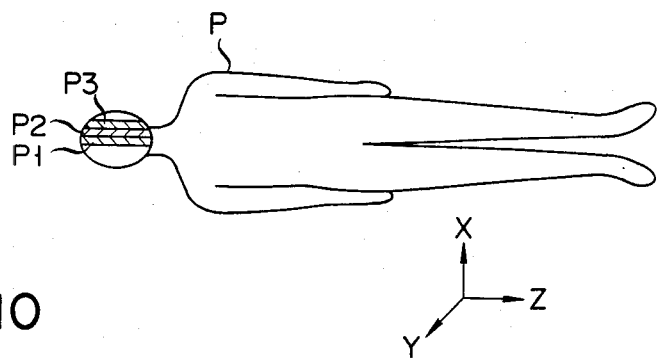
FIG. 10 shows sagittal image planes of the patient.

Electrical shifting movement of the slice plane $P_1$ as shown in FIG. 10 to the slice planes $P_2$ and $P_3$ for obtaining the desired sagittal images is performed by providing an energizing current to the coil units 19X as shown in FIG. 11B so as to apply a gradient magnetic field $G_X$ in the X direction and by varying the value of a current flowing to the solenoid coil 20Z. Then, as shown in FIG. 11D, the gradient magnetic fields $G_Y$ and $G_Z$ in the X and Z directions are generated by the coils 19X and the solenoid coils 19Z. A vector sum of these magnetic fields, $G_S=(G_X+G_Z)$, that is, a combined gradient field is applied to the patient P, and an NMR signal (FID signal) as shown in FIG. 11E is obtained. In a similar manner to that of the tomographic image plane as shown in FIGS. 8 and 9, a sagittal image can be displayed by the display/recording device 18.

The multi-slice method can be performed utilizing the NMR diagnostic apparatus of the present invention as in the following manner. As shown in the timing chart of FIG. 12, FID signals in one gradient direction under a predetermined gradient magnetic field are collected for a cross-sectional slice plane $P_1$ shown in FIG. 8. Thereafter, the exciting current of the solenoid coil 20Z in the same gradient direction is changed so as to shift the slice plane $P_1$ to a plane $P_2$ so as to collect NMR signals. Then, the slice plane is shifted from $P_2$ to $P_3$ by means of the solenoid coil 20Z in the same gradient direction and the NMR signals are collected. After the energizing current to the solenoid coil 20Z is then changed (to zero in this embodiment) so as to shift the slice plane from $P_3$ to $P_1$, the coils 19X and 19Y are energized to change the gradient direction of the combined gradient magnetic field $G_R$ and NMR signals in this direction are collected. In this manner, in a period from the collection of the FID signals in the first gradient direction for the slice plane $P_1$ to rotation of the first gradient direction to the second gradient direction for the slice plane $P_1$ of the gradient magnetic field $G_R$, the slice plane is sequentially changed from $P_1$ to $P_2$ and from $P_2$ to $P_3$ so as to allow collection of NMR signals for each of the slice planes $P_2$ and $P_3$. Accordingly, within substantially the same period as that for collecting the FID signals during one rotation of the gradient magnetic field in the slice plane $P_1$, NMR signals for reconstruction of the image in the slice planes $P_2$ and $P_3$ can also be collected. With the apparatus of the present invention, the multi-slice process can be performed within a short period of time.

In summary, an NMR diagnostic apparatus of the present invention has a simple construction wherein a gradient magnetic field shifting coil as an auxiliary coil and an energizing power supply source therefor are added to a conventional NMR diagnostic apparatus. The slice plane can be shifted freely while maintaining the patient P fixed in position with respect to the magnetic field coils. Slice plane selection can then be performed accurately within a short period of time, reducing imposition on the patient P and improving efficiency in diagnosis. When a current provided to the gradient magnetic field shifting coil is varied, the multi-slice process can be easily performed upon application of each RF pulse $H_1$. Diagnosis time can be significantly reduced, again reducing imposition on the patient.

Although the present invention has been described with reference to a particular embodiment, the present invention is not limited thereto. Various changes and modifications can be made within the spirit and scope of the present invention.

In the above embodiment, an RF pulse is a 90° selective exciting pulse. However, according to the present invention, echo signals can be collected as NMR signals using a 90°–180° pulse or NMR signals compensated by a relaxation time $T_1$ using a 90°–180° pulse can be collected. A magnet device for generating a static magnetic field may be a conductive air magnet, a superconducting air magnet, a conductive electromagnet or a permanent magnet.

In the embodiment described above, the units of coils $19X_a$ and $19X_b$ and the units of coils $19Y_a$ and $19Y_b$ of the gradient magnetic coils 19 are wound in the opposite directions. However, these coils may be wound in the same direction, and connections may be performed in such a manner that energizing currents flow in the opposite directions.

The multi-slice method described above can be modified by the following method. After collecting FID signals at a first gradient angle in a first slice plane $P_1$, FID signals are collected at a second gradient angle in a second slice plane $P_2$. Then, FID signals are collected at a third gradient angle in a third slice plane $P_3$. The slice plane is returned to the first slice plane $P_1$ to collect FID signals. Thereafter, FID signals are collected at a different gradient angle every time the gradient angle is changed. In this manner, a series of FID signals can be collected.

What is claimed is:

1. An apparatus for examining an object by nuclear magnetic resonance comprising:
   magnet means for applying to the object a static magnetic field along an axis thereof;
   gradient coil means arranged along said axis, for applying to said object a first symmetric gradient magnetic field that in conjunction with said static magnetic field gives a predetermined constant magnetic field in a substantially two-dimensional plane of said object perpendicular to said axis, and for applying to said plane at least a second symmetric gradient magnetic field perpendicular to said first gradient magnetic field for defining a line within said plane along which nuclear magnetic resonance signals are read out;
   probe head coil means for applying RF pulses to said plane to excite nuclei therein, and for detecting nuclear magnetic resonance signals derived from said line;
   shifting coil means, arranged along said axis and disposed adjacent to and independent from said gradient coil means for superimposing an additional asymmetric gradient magnetic field parallel to and on said first gradient magnetic field independently of generation of said first magnetic gradient to shift said plane of predetermined constant magnetic field intensity in a direction perpendicular to said plane; and
   reconstruction means for receiving said nuclear magnetic resonance signals and for reconstructing a computerized tomographic image for a plane selected by the cooperation of said additional magnetic field with said first gradient magnetic field.

2. An apparatus as claimed in claim 1, wherein, the gradient coil means includes:
   a first gradient magnetic field coil arranged along said longitudinal axis and having a field strength which changes linearly along a first axis perpendicular to said longitudinal axis;
   a second gradient magnetic field coil arranged along said longitudinal axis and having a field strength which changes linearly along a second axis perpendicular to said longitudinal axis and to said first axis; and
   a third gradient magnetic field coil arranged along said longitudinal axis and having a field strength which changes linearly along a third axis parallel to said longitudinal axis.

3. An apparatus as claimed in claim 2, wherein,
   said first gradient magnetic field coil includes two units of electromagnetic coils combined as a pair, each unit having two saddle-shaped coil halves combined as a pair and disposed symmetrically about said third axis and separated by a given distance,
   said second gradient magnetic field coil includes two units of electromagnetic coils combined as a pair, each unit having two saddle-shaped coil halves combined as a pair and disposed symmetrically about said third axis and perpendicular to said first gradient magnetic field coil, and
   said third gradient magnetic field coil includes a pair of electromagnetic coils having two solenoid coil halves disposed symmetrically about said third axis; and
   said shifting coil means includes:
   a first shifting electromagnetic coil having two saddle-shaped electromagnetic coil halves, one coil half being adjacent to each of said saddle-shaped coil halves of different units in said first gradient magnetic field coil;
   a second shifting magnetic coil having two saddle-shaped electromagnetic coil halves, one coil half being adjacent to each of said saddle-shaped coil halves of different units in said second gradient magnetic field coil; and
   a third shifting magnetic field coil having a solenoid coil adjacent to one of the solenoid coil halves of said third gradient magnetic coil.

4. An apparatus as claimed in claim 1, wherein
   said plane of the object for the computerized tomography images is a cross-sectional slice of the object with respect to said axis.

5. An apparatus as claimed in claim 1, wherein
   said plane of the object for the computerized tomography images is a sagittal slice of the object with respect to said axis.

6. An apparatus for examining an object by nuclear magnetic resonance, comprising:
   magnetic means for applying to the object a static magnetic field along a longitudinal axis thereof;
   means for applying a first symmetric magnetic field gradient along said axis to define a slice of said object;
   means for applying at least one second symmetric magnetic field gradient across said slice in at least one direction orthogonal to said axis for defining a line within said slice;
   means for applying at least one RF pulse to said object to selectively excite nuclei within said slice and produce resonance signals from said nuclei along said line;
   means for detecting said resonance signals from said slice;
   means for providing a shifting asymmetric gradient magnetic field to said object to cause a two-dimensional gradient null plane to move within said object in a direction perpendicular to said null plane, said shifting field providing means being adjacent to but independent of said first gradient applying means to move said null plane independently of generation of said first magnetic field gradient; and
   reconstruction means for processing said resonance signals to provide display information representing a two-dimensional matrix of elements in said slice.

7. An apparatus according to claim 6 wherein said means for applying said second magnetic field gradient includes a plurality of gradient coils disposed symmetrically with respect to the axis of an orthonormal coordinate system which is parallel to said longitudinal axis.

8. An apparatus according to claim 7 wherein said shifting magnetic field has a gradient direction opposite a gradient direction of the magnetic field gradient produced by said first gradient applying means, and wherein a field strength of said shifting field is different from a field strength of said magnetic field gradient produced by said first gradient applying means.